US008525554B2

United States Patent
Yang et al.

(10) Patent No.: US 8,525,554 B2
(45) Date of Patent: Sep. 3, 2013

(54) HIGH-SIDE SIGNAL SENSING CIRCUIT

(75) Inventors: Ta-Yung Yang, Mulpitas, CA (US);
Kai-Fang Wei, Hsinchu (TW); Yen-Ting Chen, New Taipei (TW)

(73) Assignee: System General Corporation, Taipei Hsien (TW)

( * ) Notice: Subject to any disclaimer, the term of this patent is extended or adjusted under 35 U.S.C. 154(b) by 0 days.

(21) Appl. No.: 13/338,305

(22) Filed: Dec. 28, 2011

(65) Prior Publication Data
US 2012/0306541 A1 Dec. 6, 2012

Related U.S. Application Data

(60) Provisional application No. 61/491,364, filed on May 31, 2011.

(51) Int. Cl.
*G01R 19/00* (2006.01)
(52) U.S. Cl.
USPC .................. 327/54; 327/87; 327/89; 327/540
(58) Field of Classification Search
USPC ............. 327/51, 54, 77, 87, 88, 89, 538, 540, 327/541, 542, 543, 561, 562, 563, 590; 323/312, 313, 314, 316, 317, 266, 280
See application file for complete search history.

(56) References Cited

U.S. PATENT DOCUMENTS

| 4,912,347 | A  | * | 3/1990 | Morris | 326/66 |
|-----------|-----|---|---------|-------------------|---------|
| 5,157,322 | A  | * | 10/1992 | Llewellyn | 323/315 |
| 5,235,222 | A  | * | 8/1993 | Kondoh et al. | 326/83 |
| 5,352,934 | A  | * | 10/1994 | Khan | 327/538 |
| 5,422,593 | A  | * | 6/1995 | Fujihira | 327/561 |
| 6,466,081 | B1 | * | 10/2002 | Eker | 327/541 |
| 6,686,797 | B1 | * | 2/2004 | Eker | 327/539 |
| 7,274,251 | B2 | * | 9/2007 | Yang | 327/543 |
| 2007/0194390 | A1 | * | 8/2007 | Chinthakindi et al. | 257/379 |
| 2010/0156518 | A1 | * | 6/2010 | Hoque et al. | 327/538 |

* cited by examiner

*Primary Examiner* — Lincoln Donovan
*Assistant Examiner* — Jung H. Kim
(74) *Attorney, Agent, or Firm* — Bacon & Thomas, PLLC

(57) ABSTRACT

The present invention provides a high-side signal sensing circuit. The high-side signal sensing circuit comprises a signal-to-current converter, a second transistor and a resistor. The signal-to-current converter has a first transistor generating a mirror current in response to an input signal. The second transistor cascaded with the first transistor is coupled to receive the mirror current. The resistor generates an output signal in response to the mirror current. Wherein, the level of the output signal is corrected to the level of the input signal.

10 Claims, 3 Drawing Sheets

HIGH-SIDE SIGNAL SENSING CIRCUIT

CROSS REFERENCE TO RELATED APPLICATIONS

This application claims the benefit of U.S. Provisional Application No. 61/491,364, filed on May 31, 2011, the contents of which are incorporated herein by reference.

BACKGROUND OF THE INVENTION

1. Field of the Invention

The present invention relates to signal sensing circuit, and more specifically to a high-side signal sensing circuit.

2. Description of the Related Art

FIG. 1 shows a high-side signal sensing circuit 100 in conventional arts. The high-side signal sensing circuit 100 basically comprises an operational amplifier 110, resistors 120-160, and a LOAD 170. The voltage $V_H$ supplies power to the node between the resistor 120 and the resistor 140 such that current $I_{140}$ flows through the resistor 140. Since the resistor 140 couples to the LOAD 170 and the negative input of operational amplifier 110 via the resistor 150, the current $I_{140}$ would be divided into two currents, current $I_{150}$ flowed through the resistor 150 and current $I_{LOAD}$ flowed through the LOAD 170. That is, the current $I_{LOAD}$ would be varied with the resistance value of LOAD 170 and resistors 120-150.

However, if the LOAD 170 is LEDs, the amount of current transmitted to the LOAD 170 would affect the illumination of LEDs; this means that the resistance value of resistors 120-150 would affect the illumination of LEDs when the voltage value of $V_H$ was adjusted, that is, the drawback of traditional approach, having resistors used as voltage divider for high-side signal sensing, is poor accuracy because of the temperature and process variation such that it is hard to control the illumination of LEDs and sense the load current $I_{LOAD}$ when the voltage value of $V_H$ was adjusted.

Therefore, how to control and sense the load current $I_{LOAD}$ has become an imminent task for the industries.

BRIEF SUMMARY OF THE INVENTION

The invention is directed to a high-side signal sensing circuit. The present invention provides a precise circuit for high-side signal sensing, it can be applied to the circuit of battery management, battery cell balance, LED backlight driver and power converters. The circuit can be designed in a monolithic integrated circuit. The current flowed through the output resistor could be obtained easily by sensing the cross-voltage of the first resistor.

According to an aspect of the present invention, a high-side signal sensing circuit is provided. The high-side signal sensing circuit comprises a signal-to-current converter, a second transistor and a resistor. The signal-to-current converter has a first transistor generating a mirror current in response to an input signal. The second transistor cascaded with the first transistor is coupled to receive the mirror current. The resistor generates an output signal in response to the mirror current. Wherein the level of the output signal is corrected to the level of the input signal.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

The invention can be more fully understood by reading the subsequent detailed description and examples with references made to the accompanying drawings.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
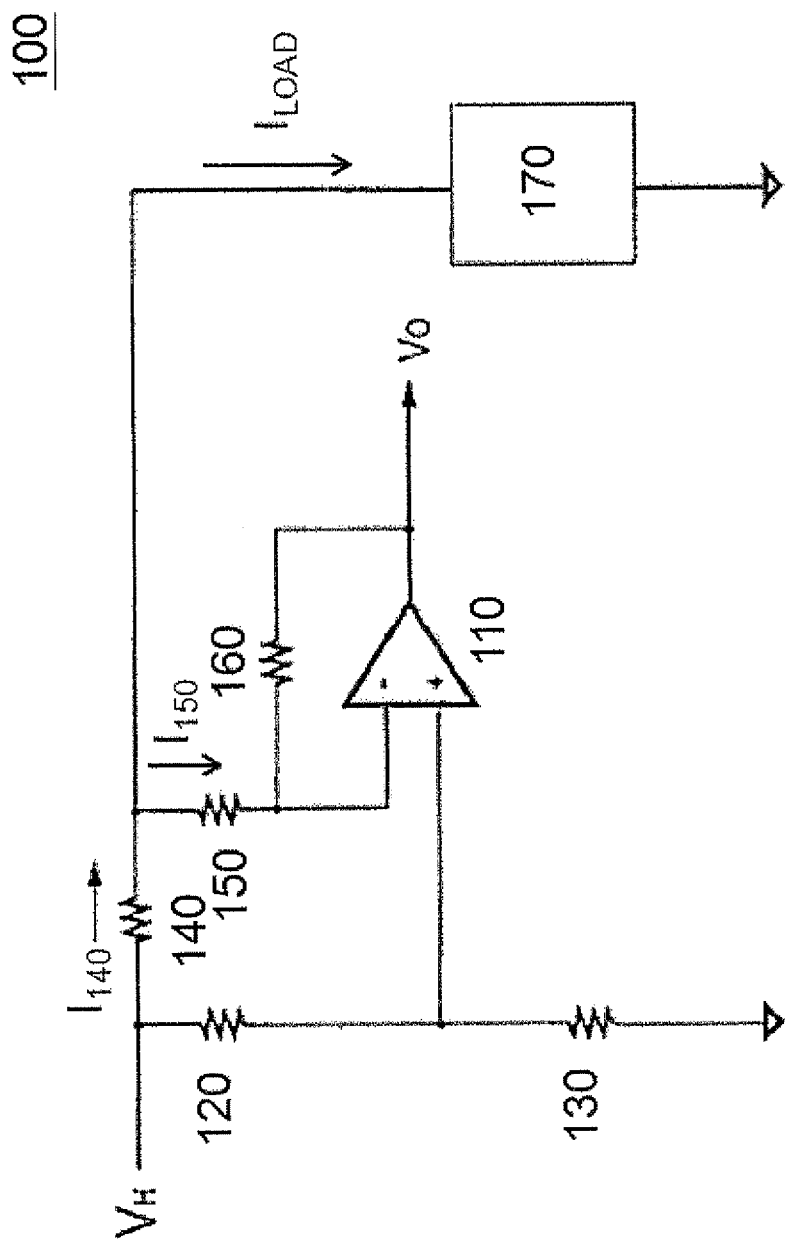
FIG. 1 shows a high-side signal sensing circuit 100 in conventional arts.
Figure 2:
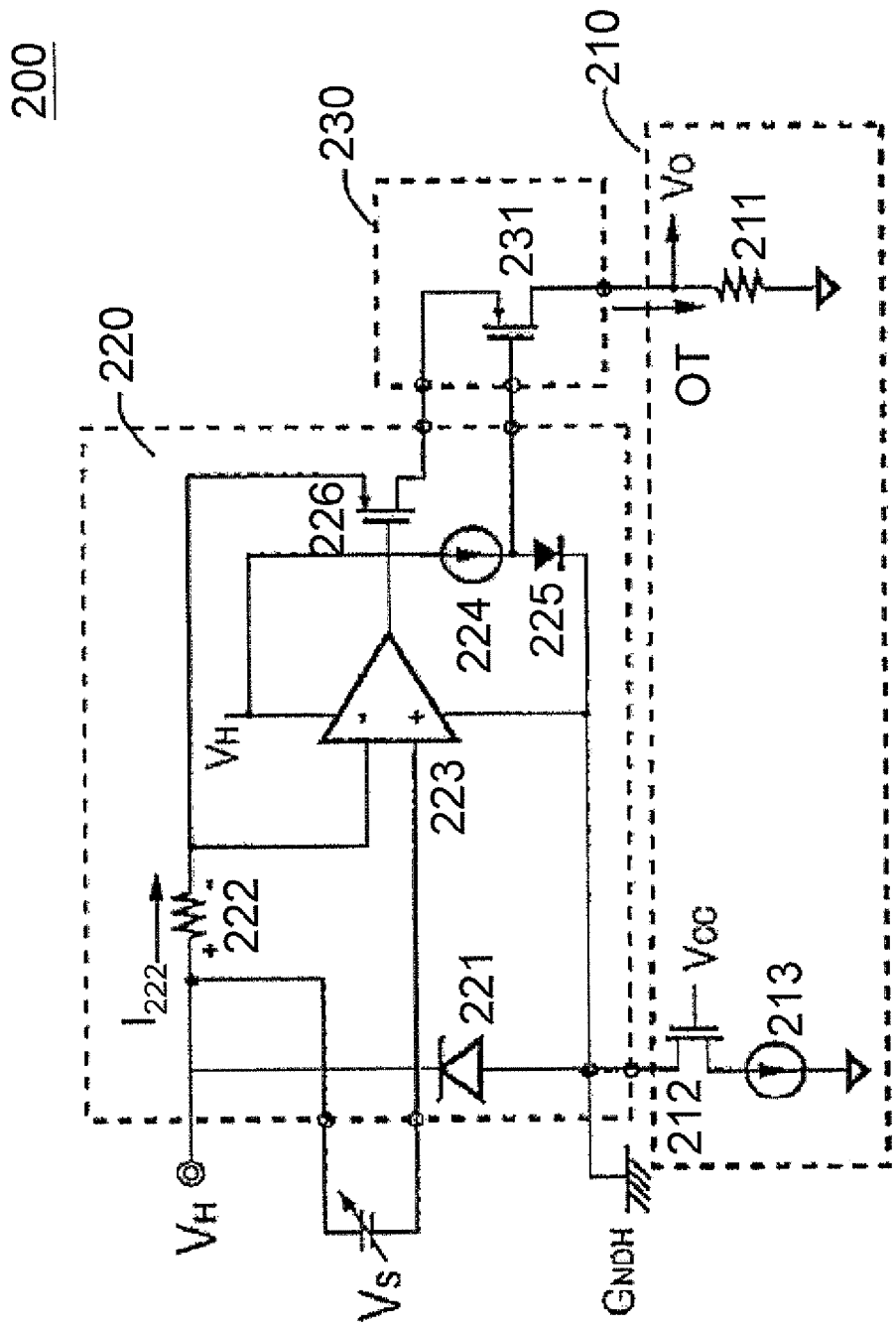
FIG. 2 shows an embodiment of a high-side signal sensing circuit.

FIG. 2 shows an embodiment of a high-side signal sensing circuit 200 according to the present invention. The high-side signal sensing circuit 200 comprises a first circuit 210, second circuit 220 and third circuit 230. The first circuit 210 includes an output resistor 211 and output terminal OT, in one embodiment the first circuit 210 further includes third transistor 212 and first current source 213. The second circuit 220, such as a signal-to-current converter 220, includes a zener diode 221, first resistor 222, operational amplifier 223, second current source 224, diode 225 and first transistor 226. The third circuit 230 includes a second transistor 231.

The second circuit 220 is used for receiving an input signal $V_S$, such as a pulse signal, and generating a current $I_{222}$ (mirror current) flowed through first resistor 222 in response to the input signal $V_s$. The operational amplifier 223, powered by a supply voltage $V_H$, second current source 224 and diode 225, couples to the input signal $V_S$ and first resistor 222, wherein the negative input of operational amplifier 223 is coupled to the first resistor 222 and source of the first transistor 226, the positive input of operational amplifier 223 is coupled to the input signal $V_S$, and the output of the operational amplifier 223 is coupled to the gate of the first transistor 226.

The input signal $V_S$, such as a variable voltage, coupled to the supply voltage $V_H$ and first resistor 222. Since the input signal $V_S$ and first resistor 222 are between the negative and the positive of the operational amplifier 223, the voltage of the input signal $V_S$ is equals to the cross-voltage of the first resistor 222 since the virtual short between the negative and the positive input of the operational amplifier 223, that is, the cross-voltage of the first resistor 222 is corrected to the voltage level of the input signal $V_S$. The source of the first transistor 226 receives the current $I_{222}$ and the drain of the first transistor 226 transmits the current to the second transistor 231. The zener diode 221, coupled to the first resistor 222, supply voltage $V_1$ and the third transistor 212, is used for clamping the maximum voltage of the power source $V_H$ of the signal-to-current converter 220.

The second transistor 231, cascaded with the first transistor 226, is coupled to receive the current $I_{222}$ transmitted through the first transistor 226, and then outputted a current $I_{211}$ to the output resistor 211. The first and the second transistor 226 and 231 are high voltage transistor that can sustain the high voltage such that the high-side signal sensing circuit 200 could be operated in a high voltage environment to sense the current flowed through the first resistor 222. In addition, the current source 224 and the diode 225 supply a voltage to the gate of the second transistor 231 such that the gate and the source voltages can be biased within the voltage range of the second circuit 230. For example, the maximum operating voltage of the second circuit 230 is $V_H$<25V ($V_H$ to $G_{NDH}$).

The output terminal OT, coupled to the second transistor 231 and an output resistor 211, receives the current $I_{231}$ transmitted from the output of the second transistor 231, and transmits the current to the output resistor 211, wherein the current flows through the output resistor 211.

An output signal $V_O$ is generated from the output terminal OT, and the output signal $V_O$ is correlated to the value of the input signal $V_S$, which can be expressed as:

$$I_{222} = \frac{V_S}{R_{222}}; V_o = \frac{R_{211}}{R_{222}} \times V_s;$$

As a result, the current flowed through the output resistor 211 could be obtained by sensing the cross-voltage of the first resistor 222. That is, the current flowed through the output resistor 211 could be sensed in a high-side, such as in the first resistor 222 in a high voltage environment, rather than in the low side, such as in the output resistor 211.

In addition, the first circuit 210 could further includes the first current source 213 and the third transistor 212, the power source of the second circuit 220 is supplied by the current source 213 through the third transistor 212, which is a high voltage transistor. The gate of the third transistor 212 is coupled to receive a voltage $V_{CC}$ that clamp the maximum voltage of the first current source 213 under the voltage $V_{CC}$. The maximum voltage of the power source of the second circuit 220 is clamped by a zener diode 221.

Figure 3:
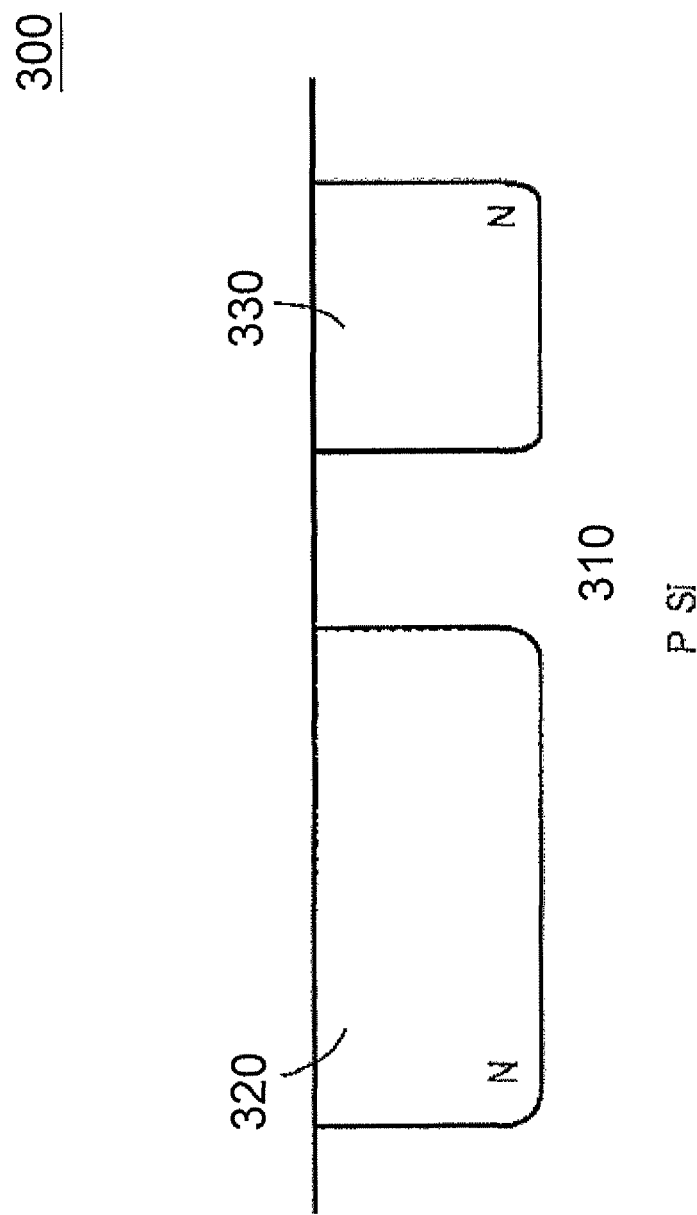
FIG. 3 shows an embodiment for the monolithic integrated circuit in accordance with the present invention.

FIG. 3 shows an embodiment for the monolithic integrated circuit in accordance with the present invention. As shown in FIG. 2 and FIG. 3, the first circuit 210 is located in the p silicon substrate P_Si. The circuits of the second circuit 220 are developed in an isolated N well 320. The circuit of the third circuit 230 is developed in another isolated N well 330. That is, the signal-to-current converter 220 could be developed in an isolated well 320 isolated from the output resistor 211. In one embodiment, the output resistor 211 is developed in a p-substrate P_Si, the signal-to-current converter 220 is developed in a first well (not shown) of the p-substrate P_Si, and the second transistor 231 is developed in a second well (not shown) of the p-substrate. In another embodiment, the output resistor 211 could be developed in a p-substrate P_Si, the signal-to-current converter 220 is developed in a first well (not shown) of the p-substrate, and the second transistor 231 could be developed in another substrate (not shown).

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high-side signal sensing circuit, comprising:
   a signal-to-current converter having a first resistor and a first transistor, the first transistor generating a mirror current in response to an input signal;
   a second transistor being serially connected with the first transistor coupled to receive the mirror current; and
   a second resistor being directly and serially connected with the second transistor and generating an output signal in response to the mirror current;
   wherein the level of the output signal is proportional to the level of the input signal and a ratio of the second resistor to the first resistor;
   wherein by sensing a cross-voltage of the first resistor, a current flowed through the second resistor is obtained.

2. The circuit as claimed in claim 1, in which
   the second resistor is located in a first circuit; and
   the signal-to-current converter and the first transistor are located in a second circuit;
   wherein the second circuit is developed in an isolated well that is isolated from the first circuit.

3. The circuit as claimed in claim 1, in which the second transistor is located in a third circuit and the third circuit is developed in another isolated circuit that is isolated from the first circuit.

4. The circuit as claimed in claim 1, in which a power source of the second circuit is supplied by a source current in the first circuit; the current of the source current is coupled to the second circuit through a high-voltage transistor.

5. The circuit as claimed in claim 1, in which the second circuit comprises a zener diode to clamp a maximum voltage of a power source of the second circuit.

6. A high-side signal detecting circuit, comprising:
   a first circuit having a first resistor located in a substrate;
   a second circuit having a second resistor and a first transistor, the second resistor being directly and serially connected with the first transistor, the first transistor located in an isolated well generating a mirror current in response to an input signal; and
   a third circuit having a second transistor being serially connected with the first transistor coupled to deliver the mirror current to the first circuit;
   wherein the first resistor generates an output signal in response to the mirror current, the level of the output signal is proportional to the level of the input signal and a ratio of the first resistor to the second resistor,
   wherein by sensing a cross-voltage of the second resistor, a current flowed through the first resistor is obtained.

7. The circuit as claimed in claim 6, in which the second circuit is developed in an isolated well that is isolated from the first circuit.

8. The circuit as claimed in claim 6, in which the third circuit is isolated from the first circuit.

9. The circuit as claimed in claim 6, in which a power source of the second circuit is supplied by a source current in the first circuit; the current of the source current is coupled to the second circuit through a high-voltage transistor in the first circuit.

10. The circuit as claimed in claim 6, in which the second circuit further comprises a zener diode to clamp a maximum voltage of a power source of the second circuit.

* * * * *